United States Patent
Herrmann et al.

(10) Patent No.: US 10,193,037 B2
(45) Date of Patent: Jan. 29, 2019

(54) METHOD FOR PRODUCING AN OPTOELECTRONIC DEVICE

(71) Applicant: OSRAM Opto Semiconductors GmbH, Regensburg (DE)

(72) Inventors: Siegfried Herrmann, Neukirchen (DE); Norwin Von Malm, Nittendorf (DE)

(73) Assignee: OSRAM OPTO SEMICONDUCTOR GMBH, Regensburg (DE)

( * ) Notice: Subject to any disclaimer, the term of this patent is extended or adjusted under 35 U.S.C. 154(b) by 169 days.

(21) Appl. No.: 15/120,504

(22) PCT Filed: Feb. 10, 2015

(86) PCT No.: PCT/EP2015/052761
§ 371 (c)(1),
(2) Date: Aug. 19, 2016

(87) PCT Pub. No.: WO2015/124464
PCT Pub. Date: Aug. 27, 2015

(65) Prior Publication Data
US 2017/0018695 A1    Jan. 19, 2017

(30) Foreign Application Priority Data
Feb. 21, 2014   (DE) ................. 10 2014 102 292

(51) Int. Cl.
*H01L 33/62* (2010.01)
*H01L 33/00* (2010.01)
(Continued)

(52) U.S. Cl.
CPC ............ *H01L 33/62* (2013.01); *H01L 25/075* (2013.01); *H01L 25/50* (2013.01);
(Continued)

(58) Field of Classification Search
CPC combination set(s) only.
See application file for complete search history.

(56) References Cited

U.S. PATENT DOCUMENTS

2009/0160065 A1* 6/2009 Haba .................. H01L 21/6835
257/777
2009/0206356 A1 8/2009 Tsuchiya
(Continued)

FOREIGN PATENT DOCUMENTS

| DE | 102011103412 A1 | 12/2012 |
|----|----|----|
| DE | 202006021128 U1 | 12/2012 |
| EP | 1 821 348 A2 | 8/2007 |
| KR | 1020090032758 A | 4/2009 |

*Primary Examiner* — Ratisha Mehta
(74) *Attorney, Agent, or Firm* — McDermott Will & Emery LLP (57) ABSTRACT

A method for manufacturing an opto-electronic component (100) is given, comprising a provision of a carrier (1) with at least one mounting surface (11), a generation of at least two vias (4) in the carrier (1) with electrically conducting contacts (12, 13) running through the vias (4), a provision of at least one light-emitting semiconductor chip (2), wherein the semiconductor chip (2) comprises a growth substrate (10) and a layer sequence (7) epitaxially grown thereon, a mounting of the at least one semiconductor chip (2) onto the at least one mounting surface (11) of the carrier (1), wherein the semiconductor chip (2) is connected in an electrically conducting manner to the contacts (12, 13) in the same method step during the mounting onto the mounting surface (11), an isolation of the carrier (1) along isolation lines (V), wherein an isolation line (V) runs through at least one of the vias (4), so that, after the isolation, the contacts (12, 13) form contact surfaces (5) at at least one side surface (1a) of the carrier (1), wherein the side surface (1a) is perpendicular to the mounting surface (11) of the carrier (1), and a mounting of the carrier (1) with the contact surfaces (5) on a connec- (Continued)

tion plate (8), wherein the mounting surface (11) is perpendicular to the connection plate (8).

15 Claims, 8 Drawing Sheets

(51) Int. Cl.
    *H01L 33/48*     (2010.01)
    *H01L 25/075*     (2006.01)
    *H01L 25/00*     (2006.01)
(52) U.S. Cl.
    CPC ........ *H01L 33/0095* (2013.01); *H01L 33/486* (2013.01); *H01L 2224/16225* (2013.01); *H01L 2224/97* (2013.01); *H01L 2933/0033* (2013.01); *H01L 2933/0066* (2013.01)

(56) References Cited

U.S. PATENT DOCUMENTS

| | | | |
|---|---|---|---|
| 2009/0242927 | A1 | 10/2009 | Kobayakawa et al. |
| 2011/0051039 | A1* | 3/2011 | Okamoto ............. G02B 6/0083 349/62 |
| 2012/0319126 | A1* | 12/2012 | Butendeich ............. H01L 33/02 257/76 |
| 2012/0326178 | A1* | 12/2012 | Fehrer ..................... H01L 24/24 257/88 |
| 2013/0069518 | A1 | 3/2013 | Kamijo |
| 2013/0207155 | A1 | 8/2013 | Herrmann |
| 2014/0008778 | A1 | 1/2014 | Zhang et al. |
| 2014/0061714 | A1* | 3/2014 | Lei ..................... H01L 33/0079 257/99 |
| 2017/0200858 | A1* | 7/2017 | Chae ....................... H01L 33/24 |

* cited by examiner

FIG 8

METHOD FOR PRODUCING AN OPTOELECTRONIC DEVICE

The invention relates to a method for producing an optoelectronic device.

This patent application claims priority from German patent application 10 2014 102 292.0, the disclosure content of which is hereby included by reference.

When producing optoelectronic devices, semiconductor chips may be applied to a carrier, in order to ensure sufficient device stability. For electrical contacting of the semiconductor chip, through-vias may be passed through the carrier, so as to enable electrical contacting from the side of the carrier remote from the semiconductor chip. In the case of carriers which are mounted sideways on a printed circuit board to achieve lateral emission of the semiconductor chip relative to the printed circuit board, it is difficult to achieve a shallow design extending to a low height above the printed circuit board. A shallow design is distinguished by good heat dissipation from the semiconductor chip into the component.

The object of the invention is to provide a method for producing an improved optoelectronic device in which the optoelectronic device emits light and is of particularly shallow construction.

This object is achieved by a method according to the independent claim. Advantageous configurations and further developments of the invention are the subject matter of the dependent claims.

According to at least one embodiment of a method for producing an optoelectronic device, the method comprises provision of a carrier with at least one mounting surface.

The carrier may preferably be an Si wafer. The carrier advantageously provides very good thermal conductivity and mechanical stability, so increasing the service life and reliability of the device. In other words, the carrier is self-supporting and constitutes a stable mounting and/or carrier base for a semiconductor chip. Advantageously, a mounting surface designed for mounting a further device, for example a semiconductor chip, is situated on the top of the carrier.

In a further step, the method comprises production of at least two through-vias in the carrier with electrically conductive contacts extending in the through-vias.

In one method step, through-vias, preferably at least two through-vias, in the form of holes through the carrier are introduced into the carrier. The holes pass right through the carrier in a vertical direction. The holes may for example be wedge-shaped, whereby the opening in the carrier created by a hole is larger on one carrier side than on the other. Furthermore, the holes may each advantageously be formed in an edge region of the carrier. The holes are spaced laterally from one another. The holes in the carrier are moreover laterally spaced from a mounting region of the semiconductor chip. The holes are electrically insulated from one another. The holes are produced for example by laser radiation, punching, drilling or etching of the carrier, advantageously by a wet etching method.

To insulate the carrier electrically, a passivation comprising an insulator material is applied to the carrier and inside the through-vias. Thus, short-circuiting through the carrier is avoided in the case of the formation of electrical conductor tracks and contacts on the carrier and in the through-vias.

The top of the carrier, and thus the mounting surface can be electrically contacted by way of the through-vias from a side of the carrier remote from the mounting surface, wherein an electrically conductive contact extends through each through-via. The contacts are introduced for example by electroplating into the holes clad with an insulator material. The contacts of the through-vias advantageously form contact pads on the top and bottom of the carrier.

By using through-vias, it is advantageously possible to make the carrier particularly thick, wherein "thick" relates to the extent of the carrier in the longitudinal direction of the through-vias, i.e. in a direction perpendicular to the mounting surface.

In a further method step, at least one light-emitting semiconductor chip is provided, wherein the semiconductor chip comprises a growth substrate and a layer sequence grown epitaxially thereon.

The semiconductor layer sequence contains an active layer. The growth substrate is preferably light-transmitting and may for example be formed with sapphire or consist of sapphire.

The semiconductor chip preferably comprises unilateral contacting. The side of the semiconductor layer sequence facing the growth substrate thus advantageously does not comprise an electrical contact region, such that efficient radiation outcoupling can be achieved through this side, wherein advantageously no shading or absorption effects arise at contacts on this side. The semiconductor chip is preferably a light-emitting diode, for example a flip-chip LED. In a flip-chip LED electrical contacting of the semiconductor chip is in particular unilateral.

According to a further method step, the at least one semiconductor chip is mounted to the at least one mounting surface of the carrier, wherein the semiconductor chip, on mounting to the mounting surface, is connected electrically conductively with the contacts in the same method step.

The at least one semiconductor chip is advantageously arranged on the mounting surface of the carrier. The semiconductor chip is arranged such that it is spaced from the through-vias in the carrier. When the carrier is viewed in plan view, the semiconductor chip may for example be arranged in a region between the through-vias. Mounting of the semiconductor chip preferably proceeds by way of a transfer method, for example in a chip-to-wafer process.

The layers of the semiconductor layer sequence, for example p and n layers, may advantageously be contacted by means of contacts extending into the semiconductor layer sequence from an opposite side of the semiconductor layer sequence to the growth substrate. The contact regions of the semiconductor layer sequence, which are preferably situated on an opposite side of the semiconductor layer sequence to the growth substrate, may advantageously be of mirroring configuration. In this way, reflection of the emitted light is increased in the direction of an emission side of the semiconductor layer sequence, away from the contact regions. Other chip embodiments and modes of contacting are also feasible.

In particular, contact regions of the at least one semiconductor chip are electrically conductively connected with the contacts of the through-vias. The semiconductor chip is for example connected electrically conductively and mechanically by means of a solder material to a mounting plate on the mounting surface of the carrier. The solder material may for example comprise gold (Au) and/or tin (Sn). Alternatively, the semiconductor chip may also be connected with the mounting plate by means of thermocompression, for example with copper-tin (Cu—Sn), or adhesive bonding. Thus, a connection which is thermally and electrically very good may advantageously be achieved between semiconductor chip and carrier.

To contact the semiconductor chip, the carrier may advantageously be coated with electrically conductive conductor tracks. In the case of advantageously unilateral contacting of the semiconductor chip at the bottom thereof facing the carrier, mutually insulated conductor tracks may be guided from the semiconductor chip to the through-vias. On mounting of the semiconductor chip, the semiconductor chip is for example placed with the contact regions on the conductor tracks and thus simultaneously connected with the contacts of the through-vias. In principle, any desired arrangement of conductor tracks is also possible which allows contact access at the semiconductor chip for both polarities from the through-vias via the carrier.

In a further method step, singulation of the carrier takes place along singulation lines, wherein a singulation line runs through at least one of the through-vias, such that after singulation the contacts form contact faces on at least one side face of the carrier, wherein the side face is perpendicular to the mounting surface of the carrier.

The singulation lines along which the carrier is singulated into carrier pieces advantageously run through the through-vias, in particular each singulation line runs through at least one through-via. The contacts advantageously run through the through-vias in such a way that the side walls of the through-via are covered at least in places by the contacts. One contact may also completely fill the through-via.

After singulation, the contact advantageously forms a contact face at at least one sub-region of a side face of the carrier which is perpendicular to the mounting surface of the carrier. In the event of two singulation lines intersecting inside a through-via, after singulation the contact advantageously simultaneously forms contact faces at two side faces of the carrier which are perpendicular to the mounting surface of the carrier.

The method further comprises mounting of the carrier with the contact faces on a connection board, wherein the mounting surface is perpendicular to the connection board.

The singulated carrier with the contact faces is advantageously mounted with a side face on a connection board, wherein after mounting the mounting surface of the carrier, on which the semiconductor chip is mounted, is perpendicular to the connection board. In other words, light emission may thus be achieved laterally of the vertical direction to the connection board. The side face of the carrier then advantageously lies over its entire area on the connection board.

According to one embodiment of the method, the semiconductor chip is arranged on the carrier in such a way that the growth substrate is situated on a side of the semiconductor chip remote from the carrier.

Mounting of the semiconductor chip preferably proceeds using a transfer method, for example in a chip-to-wafer process, wherein the semiconductor layer sequence is arranged with its side remote from the growth substrate on the mounting surface of the carrier. The transfer method allows the semiconductor chip to be positioned very precisely on the mounting surface and the carrier. The semiconductor chip is simultaneously contacted electrically with the conductor tracks on the carrier during mounting. In other words, mounting and contacting of the semiconductor chip is a single process step. The generated electromagnetic radiation, or the light, may exit through a top, remote from the semiconductor layer sequence, of the advantageously light-transmitting growth substrate and through the side faces thereof. The optoelectronic semiconductor chip then comprises a "volume emitter". Advantageously, the semiconductor layer sequence does not comprise any electrical contact region facing the growth substrate. In this way, efficient radiation outcoupling by the growth substrate may be achieved, wherein advantageously no shading or absorption effects occur on the side of the semiconductor layer sequence facing the growth substrate.

According to one embodiment of the method, after singulation the contact faces are situated on at least one common side face of the carrier, wherein the contact faces are electrically insulated from one another.

The singulated carrier is mounted with the contact faces, which are advantageously situated on the same side face of the carrier, with this side face on a connection board, advantageously on a printed circuit board, wherein after mounting the mounting surface of the carrier on which the semiconductor chip is mounted is perpendicular to the connection board. The contact faces here advantageously face the connection board and are electrically contacted and mechanically fixed by means for example of soldered joints to the connection board and/or conductor tracks on the connection board. It is thus possible electrically to contact the at least one semiconductor chip mounted on the carrier via just one side face of the carrier on a side lying on the connection board.

According to one embodiment of the method, the growth substrate is removed from the semiconductor chip after mounting of the semiconductor chip on the carrier.

The growth substrate serves in mechanical stabilization of the semiconductor chip until the semiconductor chip is mounted on the carrier. After mounting, mechanical stabilization of the semiconductor chip is no longer necessary due to the solid structure of the carrier, such that the growth substrate may be removed. Removal of the growth substrate may proceed for example mechanically, for instance by means of grinding and/or chemically, for example by means of wet chemical or dry chemical etching and/or by means of radiation, in particular laser radiation. The semiconductor chip from which the growth substrate is removed is preferably a surface emitter.

According to one embodiment of the method, mounting contacts are applied to the bottom of the semiconductor chip to mount the semiconductor chip.

By means of the mounting contacts, it is advantageously possible to produce an electrical and mechanical connection between the bottom of the semiconductor chip and the mounting surface and/or conductor tracks extending on the mounting surface.

According to one embodiment of the method, one of the mounting contacts takes the form of a contact pin which is arranged in a recess in another mounting contact.

Such a contact pin offers the possibility of electrically conductively contacting a device placed on the mounting surface, for example a semiconductor chip, from its side facing the mounting surface. To this end, the contact pin is advantageously insulated from the other mounting contacts and contacted electrically conductively with conductor tracks which extend in electrically insulated manner, for example beneath the mounting surface, to the position of the contact pin. It is thereby advantageously possible to dispense with contacting of the semiconductor chip via feed lines, for example bonding wires, not integrated into the carrier. Thus, planar contacting of the semiconductor chip may be achieved.

According to one embodiment of the method, at least one ESD protection diode is integrated into the carrier.

The semiconductor chip is protected from electrostatic discharge by means of the protection diode. An electrical voltage, arising for example as a result of electrostatic charging, may flow away via the protection diode. Damage to the semiconductor chip is thus avoided. The protection diode is electrically insulated from the carrier. The protection diode may for example be integrated into the carrier in planar manner.

According to one embodiment of the method, after mounting on the connection board the singulated carrier has a height perpendicularly above the connection board of 200 µm to 400 µm.

The singulated carrier is advantageously of particularly shallow configuration, wherein "shallow" describes a low height in the direction perpendicular to a surface of the connection board and a lateral extent (width, length) of the singulated carrier which is relatively large in relation to the height. In particular, after mounting the height of the singulated carrier amounts to 200 µm to 400 µm perpendicularly above the connection board. Furthermore, the width of the singulated carrier preferably amounts to at most 400 µm and the length of the singulated carrier preferably to 1600 µm to 2000 µm. The shallow embodiment of the carrier advantageously ensures a good thermal connection between the semiconductor chip and the connection board.

According to one embodiment of the method, the carrier comprises at least one cavity, within which the mounting surface is situated.

In one method step, at least one cavity may advantageously be formed on the top of the carrier, wherein the at least one mounting surface for one or more semiconductor chips is situated within the cavity. The through-vias are situated outside the cavity. For example, the cavity may be introduced into the carrier by means of KOH etching. Consequently, the at least one semiconductor chip may be mounted within the cavity using the methods already described. To this end, conductor tracks are guided over the internal walls of the cavity to the mounting surface. The cavity may advantageously comprise mirrored internal walls or mirrored conductor tracks, whereby light emission is amplified in the direction of the mouth of the cavity.

According to one embodiment of the method, the semiconductor chip is potted inside the cavity with a potting compound.

The potting material is for example a silicone material. The semiconductor chip may here for example be potted in a planar manner, such that the potting compound forms a planar surface with the top of the semiconductor chip and advantageously terminates flush with the semiconductor chip. Due to the shallow configuration of the semiconductor chip, planar potting of the semiconductor chip is advantageously simplified. In this case, a potting thickness of for example 40 µm may be achieved. Alternatively, it is possible for the potting compound to cover the semiconductor chip or only partially surround it.

According to one embodiment of the method, the potting compound comprises $TiO_2$.

In one configuration, the potting compound is a reflective potting compound. The reflective potting compound intensifies emission in the direction of the cavity mouth, and advantageously covers absorbing patterns on the carrier within the cavity.

According to one embodiment of the method, the growth substrate comprises sapphire.

According to one embodiment of the method, the semiconductor chip is covered with a converter element.

A converter element which at least partly covers the semiconductor chip may advantageously be applied to the semiconductor chip. Equally, a potting compound used to pot the semiconductor chip in a cavity may advantageously also comprise at least one converter material. The converter element is configured to convert the radiation emitted by the semiconductor chip partially or completely into at least one further radiation with a wavelength different from the radiation emitted by the semiconductor chip. The converter material advantageously comprises a ceramic.

According to one embodiment of the method, the converter element is applied by spraying onto the semiconductor chip.

Spray application of the converter element proceeds for example by means of spray coating technology. Spray application advantageously makes it easier to apply converter material to side faces of the semiconductor chip.

Further advantages, advantageous embodiments and further developments are revealed by the exemplary embodiments described below in association with the figures.

Identical or identically acting elements are provided with identical reference numerals in each of the figures. The components illustrated in the figures and the size ratios of the components to one another should not be regarded as to scale.

Figure 1:
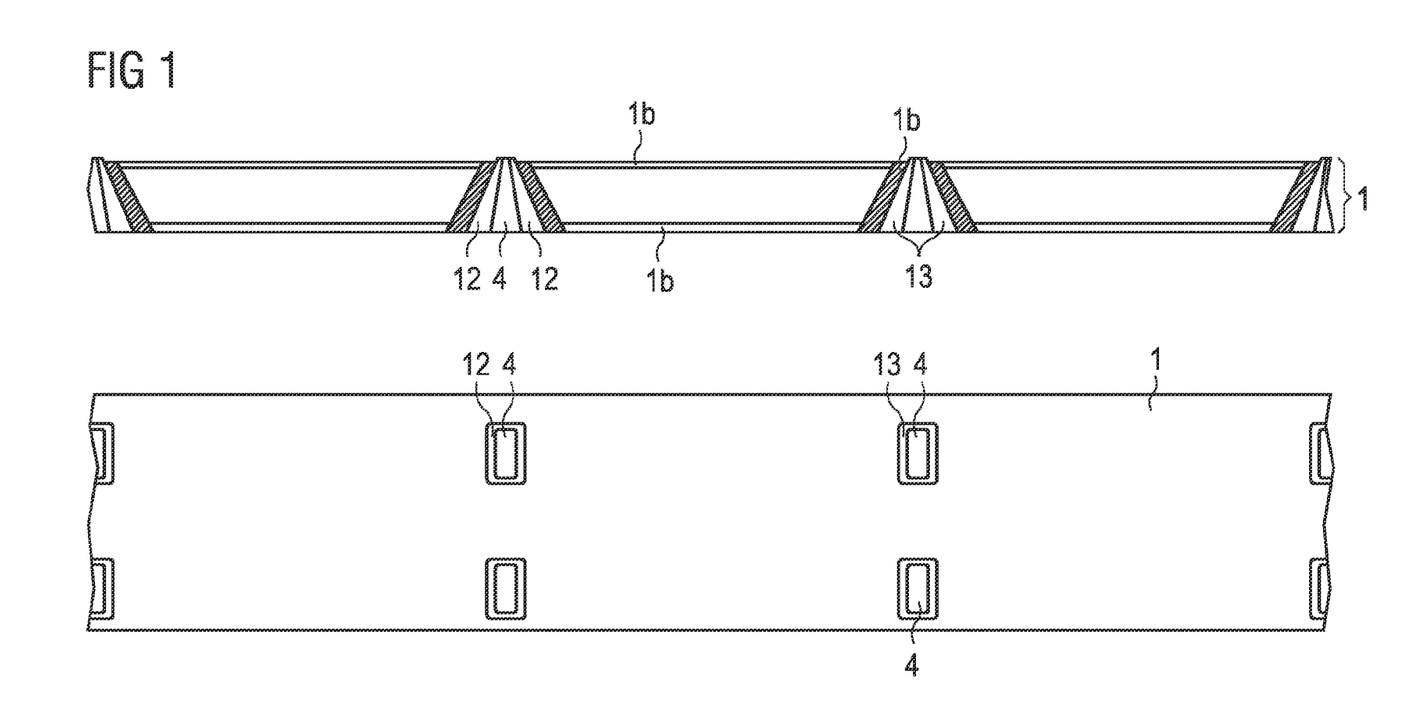
FIG. 1 is a schematic representation of a subportion of a carrier in side view and plan view after a method step for producing through-vias.

FIG. 1 is a schematic representation of a subportion of a carrier 1 in side view (top) and plan view (bottom). In one method step, through-vias 4 are introduced into the carrier 1 in the form of holes through the carrier. The holes pass right through the carrier in a vertical direction and are wedge-shaped, wherein the opening in the carrier created by the hole is smaller at the top of the carrier than at the bottom of the carrier 1. The through-vias 4 are spaced laterally from one another. The holes are produced for example by laser radiation, punching, drilling or etching of the carrier, advantageously by a wet etching method.

The carrier 1 is furthermore electrically insulated, wherein a passivation 1b comprising an insulator material is applied to the carrier 1 and inside the through-vias 4. The through-vias 4 are thus also insulated electrically from the carrier 1.

After insulation of the carrier 1, the contacts 12, 13 are introduced into the through-vias 4 by electroplating into the holes clad with a passivation 1b. The contacts 12, 13 advantageously form contact pads on the top and bottom of the carrier.

Figure 2:
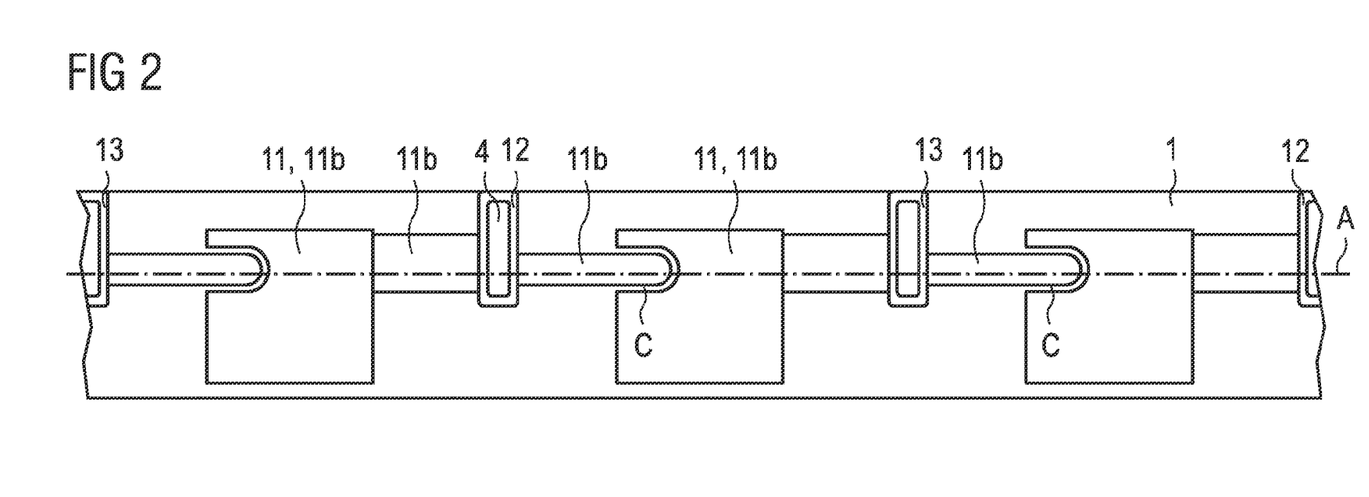
FIG. 2 is a schematic representation of a subportion of a carrier in plan view after a further method step for forming conductor tracks.

FIG. 2 is a schematic representation of a subportion of a carrier 1 in plan view. Mounting surfaces 11 on the carrier 1 are connected by means of conductor tracks 11b on the carrier 1 with the contacts 12, 13 of the through-vias 4. The conductor tracks 11b connect in each case one mounting surface 11 with the two adjacent through-vias 4 along a rewiring plane A. The conductor tracks 11b for example comprise TiPtAu. A conductor track 11b applied flat partially over the mounting surface 11 comprises a recess C, into which a further conductor track 11b extends from another through-via 4, wherein the conductor tracks 11b do not come into contact in the region of the mounting surface 11 and are electrically insulated from one another. In principle, any desired arrangement of conductor tracks 11b is also possible which allows contact access at the mounting surface 11 via the carrier for both polarities. One of the conductor tracks 11b is in this case connected with one polarity to a contact 12, 13 and the other conductor track 11b to a contact 12, 13 of a different polarity. The through-vias 4 with the contacts 12, 13 are arranged at the edges of the carrier 1, in other words in the region of the through-vias 4 the contacts 12, 13 extend as far as the same side face of the carrier 1. Advantageously a device, for example a semiconductor chip, may be mounted on the mounting surface 11, wherein the device to be mounted preferably comprises electrical contacts at the position of recess C and the conductor track 11b insulated therefrom.

Figure 3:
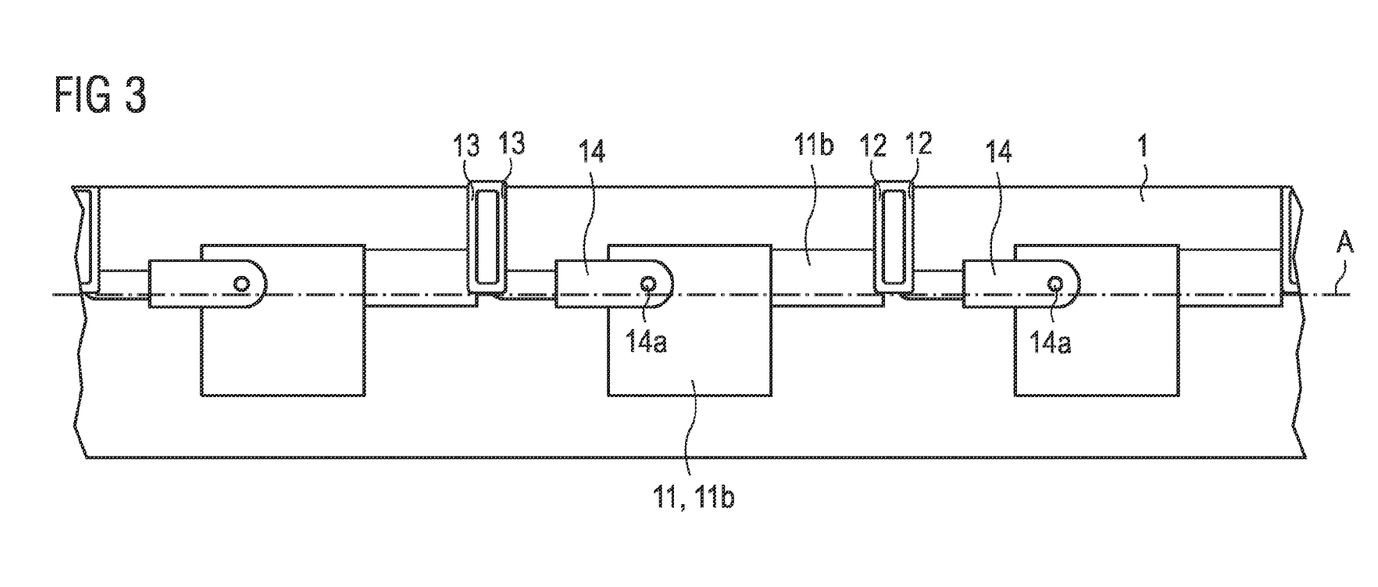
FIG. 3 shows the plan view onto the carrier of FIG. 2 according to a further example of the method for forming conductor tracks.

FIG. 3 shows a subportion of a carrier 1 in plan view according to FIG. 2, wherein in each case an insulation 14 has been applied to the conductor tracks 11b extending into the recesses C. The insulation 14 here covers the conductor track 11b at the recess C in a region in which the conductor tracks 11b enclose one another. An opening 14a in the form of a hole is formed in the insulation 14. The insulation 14 for example comprises SiN. This opening 14a offers the possibility of bringing a device, for example a semiconductor chip, placed on the mounting surface 11 into contact with a conductor track 11b beneath the insulation 14.

Figure 4:
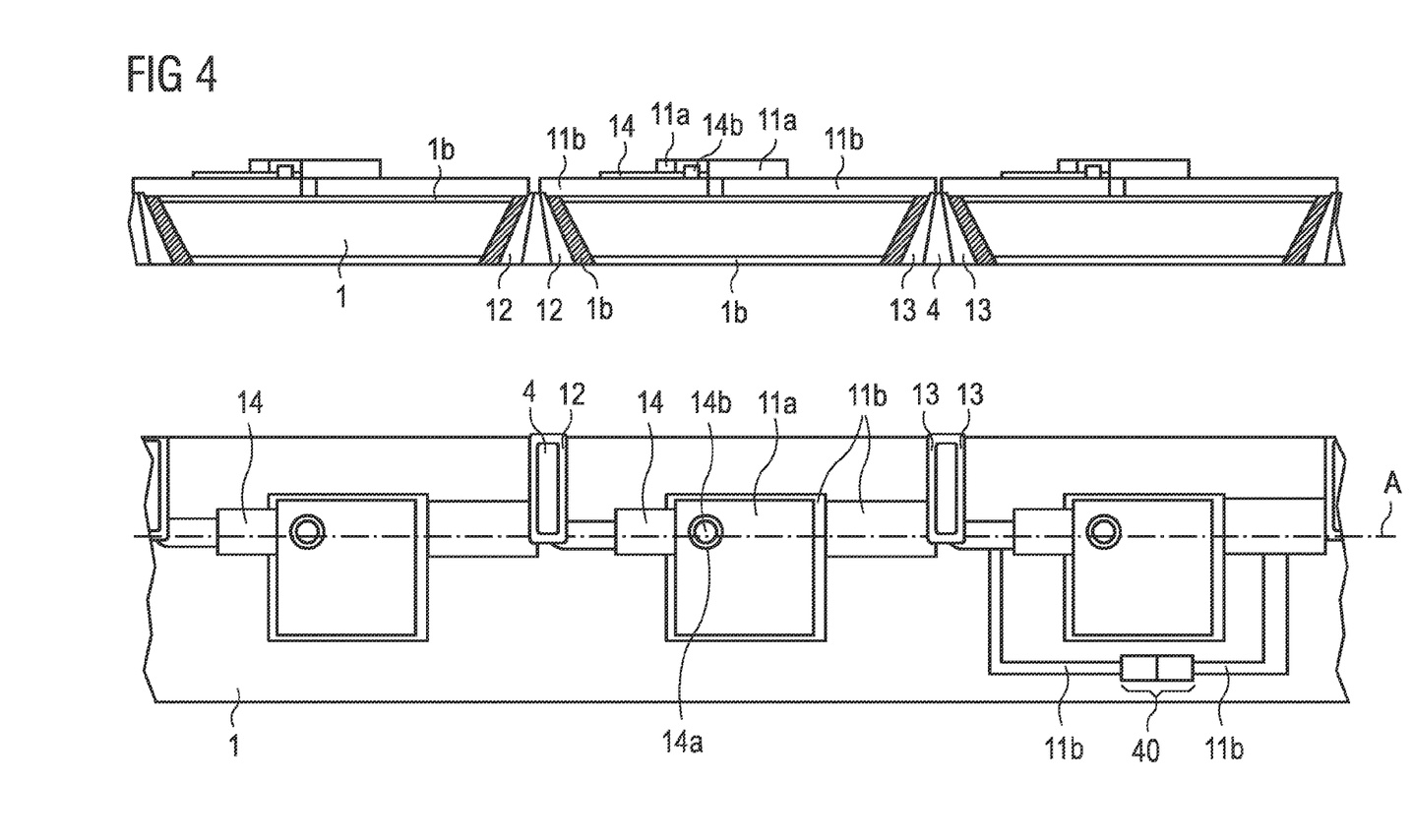
FIG. 4 is a schematic representation of a subportion of a carrier in plan view and side view after a further method step for forming conductor tracks and a mounting plate.

FIG. 4 shows a subportion of a carrier 1 in plan view (bottom) according to FIG. 3 and in side view (top). A mounting plate 11a is in each case applied to the mounting surfaces 11 and the conductor tracks 11b, on which mounting plate 11a a further device, for example a semiconductor chip, may be mounted and contacted. The mounting plate 11a here covers the insulation 14 located in the region of the mounting surface 11 over the recess of the conductor track 11b. The mounting plate 11a further comprises an opening 14a similar to the insulation 14 and at the same position, wherein a contact pin 14b is passed through a hole in the insulation 14 to the conductor track 11b, and thus is connected with a contact 12, 13 of the through-via 4. The contact pin 14b is in this case not in direct contact with the remainder of the mounting plate 11a. The other region of the mounting plate 11a is in electrical and mechanical contact with a conductor track 11b, which is connected with a contact 12, 13 of another through-via 4. In this way, planar contacting is advantageously achieved. The mounting plate 11a for example comprises Au or AuSn. Furthermore, an ESD protection diode 40 is advantageously connected with the conductor tracks 11b and thus with the contacts 12, 13. The ESD protection diode is in this case applied in planar manner to the carrier 1 or integrated into the carrier and interconnected in antiparallel with the contacting polarity of the mounting plate 11a and of the contact pin 14b. In addition, the ESD protection diode likewise comprises a small thickness, such that a particularly thin semiconductor component may be produced.

Figure 5:
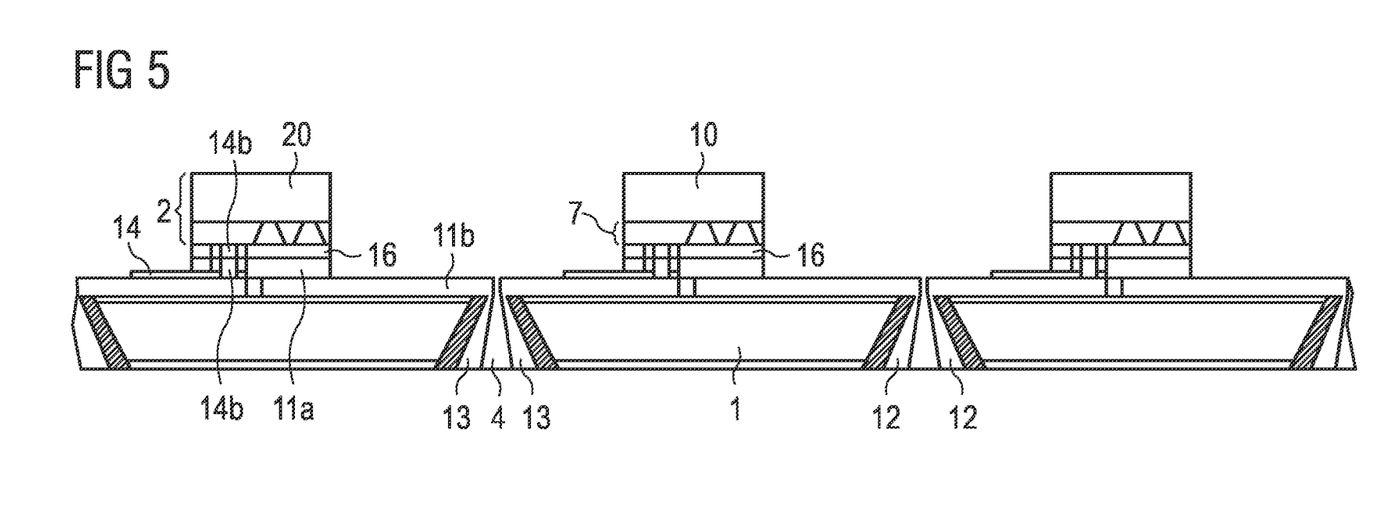
FIG. 5 is a schematic representation of a subportion of the carrier of FIG. 4 in side view after a further method step for mounting a semiconductor chip on the carrier.

FIG. 5 shows a subportion of a carrier 1 according to FIG. 4 in side view, wherein one semiconductor chip 2 is mounted on each of the mounting plates 11a. The mounting plate 11a is located between the semiconductor chip 2 and the conductor tracks 11b. A semiconductor chip 2 is advantageously provided in the form a growth substrate 10 with a semiconductor layer sequence 7 grown epitaxially thereon, which comprises an active layer. After mounting of the semiconductor chip 2, the growth substrate 10 may be detached from the semiconductor layer sequence 7 and is no longer shown in the far left-hand semiconductor chip of FIG. 5. Mounting of the semiconductor chip preferably proceeds by way of a transfer method, for example in a chip-to-wafer process, wherein the semiconductor chip 2 is mounted on the mounting plate 11a with a side remote from the growth substrate. The transfer method allows the semiconductor chip to be positioned very precisely on the mounting plate 11a and the carrier. The semiconductor chip comprises unilateral contacting facing the mounting plate 11a. The side, remote from the mounting plate 11a, of the semiconductor layer sequence 7 thus advantageously does not comprise any electrical contact region, such that efficient radiation outcoupling may be achieved through this side. The semiconductor chip is for example a flip-chip LED. The semiconductor layer sequence 7 is simultaneously contacted during mounting electrically with the conductor tracks 11b on the carrier.

The layers of the semiconductor layer sequence 7, for example p and n layers, are contacted by means of contacts extending into the semiconductor layer sequence. The contact regions at the bottom of the semiconductor layer sequence may advantageously be of mirroring configuration. In this way, reflection of the emitted light away from the contact regions is increased.

The contact regions of the semiconductor chip 2 are connected electrically conductively and mechanically, for example by means of a solder material, to the mounting plate 11a and the contact pin 14b. To this end, for example, further mounting contacts 16 comprising Au are applied to the bottom of the semiconductor layer sequence 7. The mounting contacts 16 correspond in shape precisely to the shape of the mounting plate 11a. Thus, one of the mounting contacts 16 likewise takes the form of a contact pin and is connected with the contact pin 14b of the mounting plate 11a. The solder material may for example comprise gold (Au) and/or tin (Sn). The mounting contacts 16 may also be connected by means of thermocompression, for example with copper-tin (Cu—Sn), to the mounting plate 11a. Thus, a connection which is thermally, mechanically and electrically very good may advantageously be achieved between semiconductor chip and mounting plate 11a.

The far left-hand semiconductor chip of FIG. 5 shows that a converter element 20 may be applied to the semiconductor chip 2, covering said semiconductor chip. The converter element is configured to convert the radiation emitted by the semiconductor chip partially or completely into at least one further radiation with a wavelength different from the radiation emitted by the semiconductor chip. The converter material advantageously comprises a ceramic. The converter element 20 is for example applied to the semiconductor chip 2 by spraying. The semiconductor chip with the converter element 20 may take the form of a surface or volume emitter. Above all, spray application makes it easier to apply the converter material to side faces of the semiconductor chip.

Figure 6:
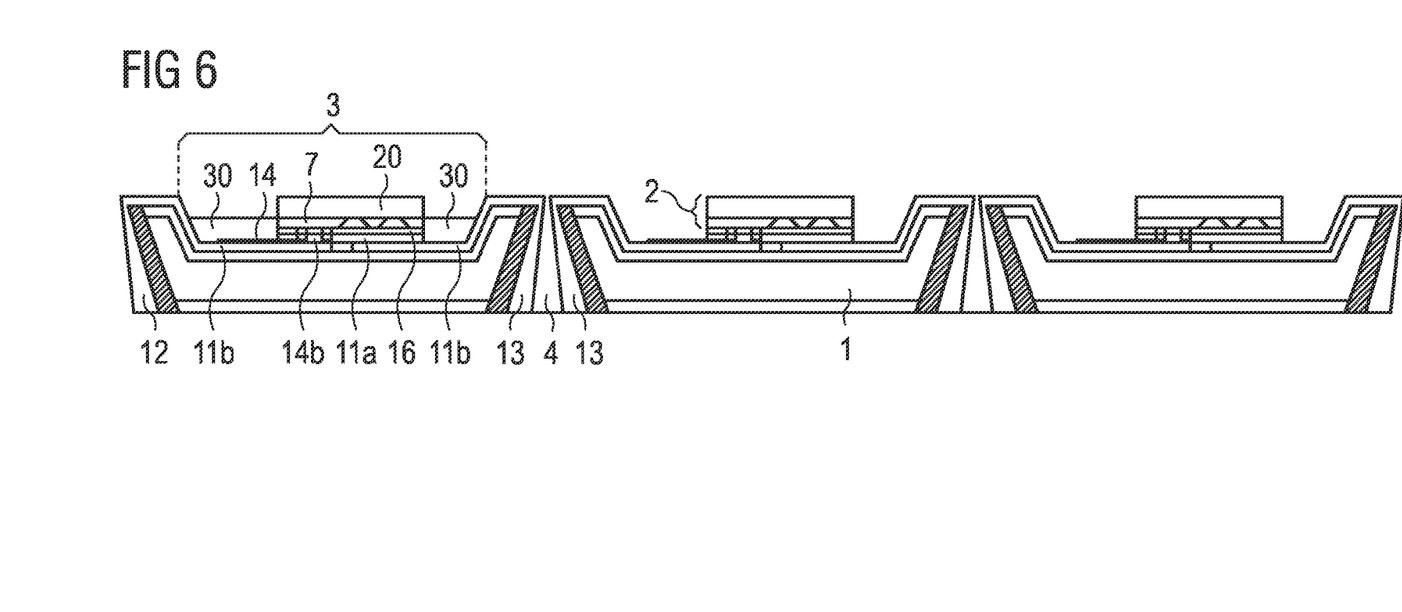
FIG. 6 is a schematic representation of a subportion of the carrier of FIG. 5 in side view according to a further example of the method.

FIG. 6 shows a subportion of a carrier 1 in a side view according to FIG. 5. In an additional method step, cavities 3 have been introduced into the carrier 1 by means of for example KOH etching. The mounting surfaces and the semiconductor chips 2 are situated in the cavities 3. The cavities 3 may be formed with mirrored internal walls, to increase emission efficiency in the direction perpendicularly away from the mounting surface. The conductor tracks 11b extend over the internal walls of the cavities 3 to the contacts 12, 13.

Inside the cavities 3 the semiconductor chips 2 are potted with a potting compound 30. The potting compound 30 here for example fills the cavity 3 up to the bottom of the converter element 20. Thus, light absorbing patterns on the semiconductor chip 2 and on the bottom of the cavity 3, for example the conductor tracks 11b, are covered by the potting compound 30. In the case of a semiconductor chip 2 in the form of a volume emitter, light emitted laterally by the converter element 20 is reflected by the mirrored internal walls of the cavity 3 in the direction of the mouth of the cavity 3.

Alternatively, a surface-emitting converter element 20 with a potting compound is conceivable, wherein the potting compound terminates in planar manner with the top of the converter element 20. The potting compound 30 is for example of reflective configuration and preferably comprises $TiO_2$. A planar potting compound may advantageously prevent unconverted radiation from being outcoupled out of the side faces of the semiconductor chip and mixed in disturbing manner with the converted radiation. Due to the shallow configuration of the semiconductor chip, planar potting of the semiconductor chip is advantageously simplified. In this case, a potting thickness of for example 40 μm may be achieved.

Figure 7:
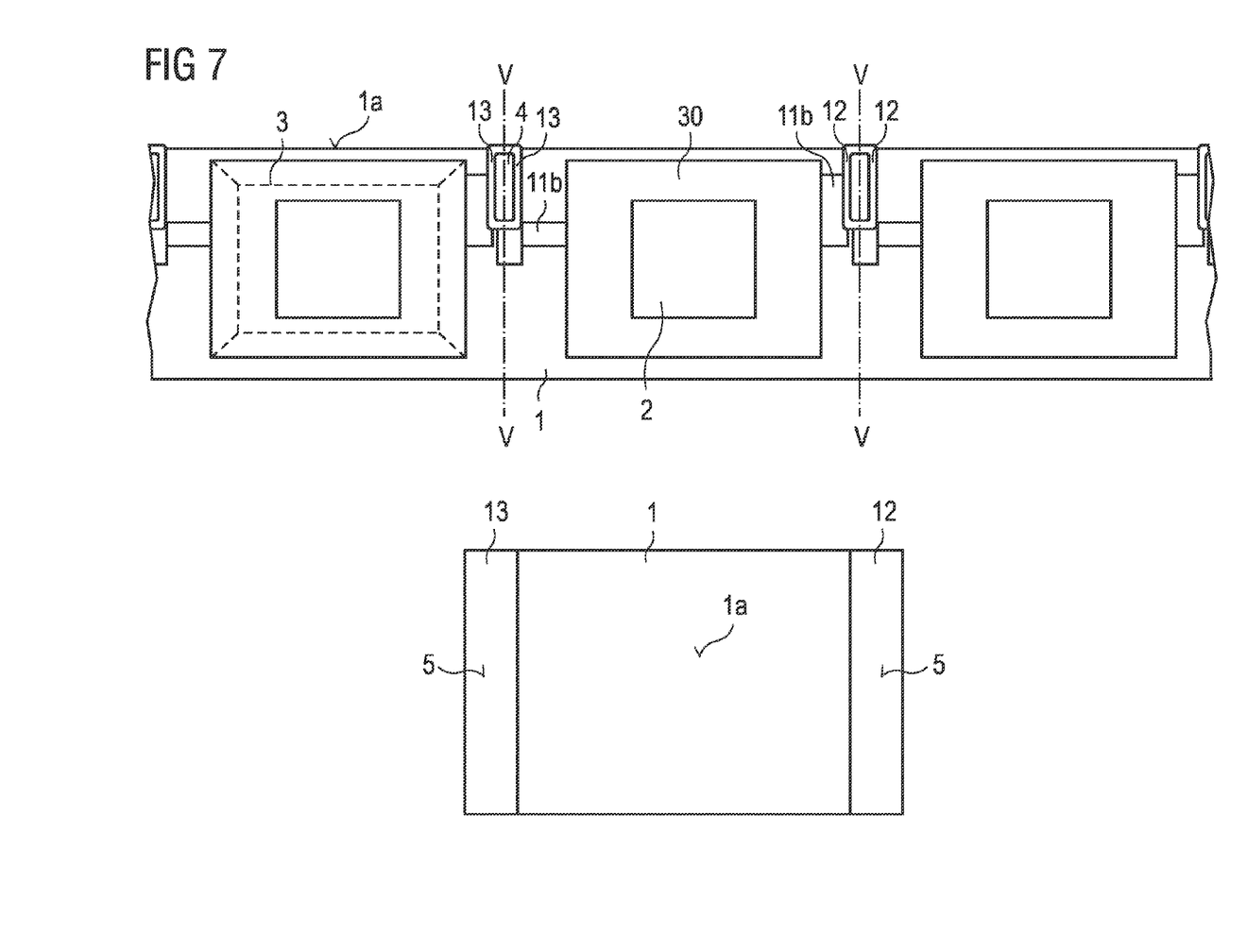
FIG. 7 is a schematic representation of a subportion of the carrier of FIG. 5 or FIG. 6 in side view and plan view after a further method step for singulating the carrier.

FIG. 7 shows a subportion of a carrier 1 in plan view (top) and a singulated carrier in side view (bottom). In one method step singulation of the carrier 1 proceeds along singulation lines V, wherein one singulation line V runs through one of the through-vias 4, such that after singulation the contacts 12, 13 form contact faces 5 on the same side face 1a of the carrier 1, wherein the side face 1a is perpendicular to the mounting surface of the carrier. In the plan view (top) the cavity 3 is potted with the potting compound 30. The contours of the internal walls of the cavity are shown by dashed lines.

Figure 8:
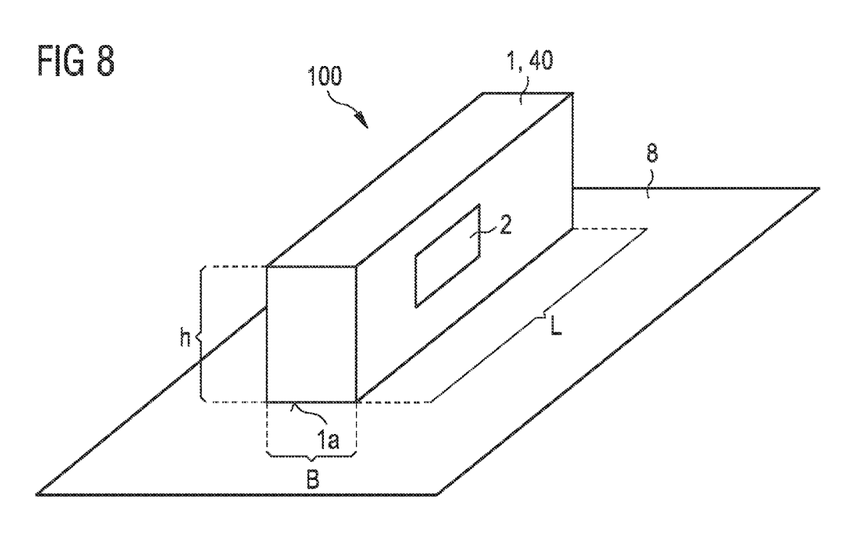
FIG. 8 is a schematic representation of a singulated carrier of FIG. 7 after a further method step for mounting on a connection board.

FIG. 8 shows an optoelectronic device 100 after the singulated carrier 1 has been mounted with the side 1a on a connection board 8, wherein the mounting surface on the carrier and the semiconductor chip 2 are perpendicular to the connection board 8. This enables lateral emission relative to the connection board 8.

In this case, the contact faces of the carrier face the connection board 8 and are electrically contacted and mechanically fixed with the connection board 8 by means for example of soldered joints.

The singulated carrier is advantageously of particularly shallow configuration, wherein "shallow" describes a low height h in the direction perpendicular to a surface of the connection board and a lateral extent (width B, length L) of the singulated carrier which is relatively large in relation to the height. In particular, after mounting the height h of the singulated carrier amounts to 200 μm to 400 μm perpendicularly above the connection board. Furthermore, the width B of the singulated carrier 1 preferably amounts to at most 400 μm and the length L of the singulated carrier preferably to 1600 μm to 2000 μm. The shallow embodiment of the carrier advantageously ensures a good thermal connection between the semiconductor chip and the connection board 8. According to the method, the carrier 1 may be configured with or without cavities. Furthermore, an ESD protection diode 40 may be integrated into the carrier 1. The protection diode 40 is in this case electrically insulated from the carrier 1 and may for example be integrated in planar manner into the carrier. The singulated carrier advantageously takes on a prismatic configuration on singulation. Thus, rectangular shapes and in particular a flat bearing face result, which prevent tilting of the singulated carrier on the connection board. Thus, for example, a skewed arrangement of the singulated carrier and emission in a direction not extending parallel to the connection board may be avoided.

The description made with reference to exemplary embodiments does not restrict the invention to these embodiments. Rather, the invention encompasses any novel feature and any combination of features, including in particular any combination of features in the claims, even if this feature or this combination is not itself explicitly indicated in the claims or exemplary embodiments.

The invention claimed is:

1. Method for producing an optoelectronic device, comprising:
    providing a carrier, with at least one mounting surface,
    producing at least two through-vias in the carrier with electrically conductive contacts extending in the through-vias,
    providing at least one light-emitting semiconductor chip, wherein the semiconductor chip comprises a growth substrate and a layer sequence grown epitaxially thereon,
    mounting the at least one semiconductor chip to the at least one mounting surface of the carrier, wherein the semiconductor chip, on mounting to the mounting surface, is connected electrically conductively with the contacts in the same method step,
    singulating the carrier along singulation lines (V), wherein a singulation line (V) runs through at least one of the through-vias, such that after singulation the contacts form contact faces on at least one side face of the carrier, wherein the side face is perpendicular to the mounting surface of the carrier, and
    mounting the carrier with the contact faces on a connection board, wherein the mounting surface is perpendicular to the connection board.

2. Method for producing an optoelectronic device according to claim 1, in which the semiconductor chip is arranged on the carrier in such a way that the growth substrate is situated on a side of the semiconductor chip remote from the carrier.

3. Method for producing an optoelectronic device according to claim 1, in which after singulation the contact faces are situated on at least one common side face of the carrier, wherein the contact faces are electrically insulated from one another.

4. Method for producing an optoelectronic device according to claim 1, in which the growth substrate is removed from the semiconductor chip after mounting of the semiconductor chip on the carrier.

5. Method for producing an optoelectronic device according to claim 1, in which mounting contacts are applied to the bottom of the semiconductor chip for mounting the semiconductor chip.

6. Method for producing an optoelectronic device according to claim 5, in which one of the mounting contacts takes the form of a contact pin, which is arranged in a recess of an another mounting contact.

7. Method for producing an optoelectronic device according to claim 1, in which at least one ESD protection diode is integrated into the carrier.

8. Method for producing an optoelectronic device according to claim 1, in which, after mounting on the connection board, the singulated carrier has a height perpendicularly above the connection board of 200 μm to 400 μm.

9. Method for producing an optoelectronic device according to claim 1, in which the carrier comprises at least one cavity, within which the mounting surface is situated.

10. Method for producing an optoelectronic device according to claim 9, in which the semiconductor chip is potted inside the cavity with a potting compound.

11. Method for producing an optoelectronic device according to claim 10, in which the potting compound comprises $TiO_2$.

12. Method for producing an optoelectronic device according to claim 1, in which the growth substrate comprises sapphire.

13. Method for producing an optoelectronic device according to claim 1, in which the semiconductor chip is covered with a converter element.

14. Method for producing an optoelectronic device according to claim 13, in which the converter element is applied to the semiconductor chip by spraying.

15. Method for producing an optoelectronic device, comprising:
   providing a carrier, with at least one mounting surface,
   producing at least two through-vias in the carrier with electrically conductive contacts extending in the through-vias,
   providing at least one light-emitting semiconductor chip, wherein the semiconductor chip comprises a growth substrate and a layer sequence grown epitaxially thereon,
   mounting the at least one semiconductor chip to the at least one mounting surface of the carrier, wherein the semiconductor chip, on mounting to the mounting surface, is connected electrically conductively with the contacts in the same method step,
   singulating the carrier along singulation lines (V), wherein a singulation line (V) runs through at least one of the through-vias, such that after singulation the contacts form contact faces on at least one side face of the carrier, wherein the side face is perpendicular to the mounting surface of the carrier, and
   mounting the carrier with the contact faces on a connection board, wherein the mounting surface is perpendicular to the connection board, wherein after mounting on the connection board, the singulated carrier has a height perpendicularly above the connection board of 200 μm to 400 μm.

\* \* \* \* \*